(12) United States Patent
Lombardi et al.

(10) Patent No.: US 9,063,182 B2
(45) Date of Patent: Jun. 23, 2015

(54) DETECTING THREE DIFFERENT OPEN RANGES IN A FLIP DEVICE

(75) Inventors: Michael J. Lombardi, Mundelein, IL (US); John Gorsica, Round Lake, IL (US); Roger W. Harmon, Crystal Lake, IL (US); Narendra A. Patel, Gurnee, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 1834 days.

(21) Appl. No.: 12/291,483

(22) Filed: Nov. 10, 2008

(65) Prior Publication Data

US 2010/0117629 A1 May 13, 2010

(51) Int. Cl.
*G01R 33/02* (2006.01)
*G01R 33/00* (2006.01)
*G01D 5/14* (2006.01)
*G01R 33/07* (2006.01)

(52) U.S. Cl.
CPC ............ *G01R 33/0005* (2013.01); *G01D 5/145* (2013.01); *G01R 33/07* (2013.01)

(58) Field of Classification Search
CPC ..... G01D 5/145; G01R 33/07; G01R 33/0005
USPC ..................................................... 324/207.2
See application file for complete search history.

(56) References Cited

U.S. PATENT DOCUMENTS

| | | | |
|---|---|---|---|
| 6,115,620 A | 9/2000 | Colonna et al. | |
| 6,434,371 B1 | 8/2002 | Claxton | |
| 6,839,576 B2 | 1/2005 | Aagaard et al. | |
| 6,922,573 B2 | 7/2005 | Hijii | |
| 7,239,898 B2 | 7/2007 | Lenchik et al. | |
| 7,336,078 B1* | 2/2008 | Merewether et al. | 324/326 |
| 2002/0093328 A1 | 7/2002 | Maatta et al. | |
| 2003/0020465 A1 | 1/2003 | Wolf | |
| 2004/0056651 A1 | 3/2004 | Marietta Bersana | |
| 2010/0057359 A1* | 3/2010 | Caballero et al. | 701/214 |

FOREIGN PATENT DOCUMENTS

| | | |
|---|---|---|
| EP | 1755317 A1 | 2/2007 |
| KR | 10-2006-0070960 A | 6/2006 |
| KR | 10-2007-0063629 A | 6/2007 |

OTHER PUBLICATIONS

Choi, Sok Jin: "The International Search Report and the Written Opinion of the International Searching Authority", Korean Intellectual Property Office, mailing date: Jun. 23, 2010, 11 pages.

* cited by examiner

*Primary Examiner* — Thomas F Valone
(74) *Attorney, Agent, or Firm* — Leydig, Voit & Leydig, Ltd.

(57) ABSTRACT

A magnetic field sensor, such as a Hall effect sensor, and a corresponding magnetic field producing unit, such as a magnet, can be both positioned near a hinge of a hinged device, such that the magnet, in one part of the device, rotates around the Hall effect sensor, in another part of the device. Three positions can, thereby be detected: (1) when the device is closed and the magnet is "above" the sensor, (2) when the device is partially open and the magnet is "to the side" of the sensor, and (3) when the device is fully open and the magnet is "below" the sensor. The hinged device can have the hinge offset slightly to enable the magnet to rotate around the sensor as described. Alternatively, the locations of the magnet and sensor can be reversed.

20 Claims, 5 Drawing Sheets

DETECTING THREE DIFFERENT OPEN RANGES IN A FLIP DEVICE

FIELD OF THE INVENTION

This invention relates generally to magnetic field sensors in a hinged device, and more particularly to the incorporation of a magnetic field sensor and a magnetic field producing unit proximate to the hinge of the hinged device.

BACKGROUND OF THE INVENTION

Modern electronic devices often utilize a myriad of sensors to determine various aspects about the devices themselves or their environment. Of primary concern, of course, is that such sensors can actually provide the requisite information. Only slightly less important, however, is the cost and complexity of such sensors. Specifically, complex sensors can be more prone to failure and costly sensors can quickly exceed the budget for a particular project.

One type of sensor often utilized to determine the physical proximity of one component to another is a magnetic field sensor that can sense a magnetic field, typically produced by a magnetic field producing unit located in the other component whose proximity is to be detected. For example, a Hall effect sensor can sense the magnetic field produced by a magnet. Consequently, if a Hall effect sensor is placed in one component, and a magnet is placed in another component, the two components can be determined to be proximate to one another when the Hall effect sensor detects a magnetic field, and they can be determined to be distant from one another when it does not.

Magnetic field sensors, such as Hall effect sensors, are often utilized in "flip" devices that comprise two components connected by a hinge that can open and close in a clamshell fashion. Knowing whether such a flip device is opened or closed can enable the device to respond accordingly. For example, a flip computing device can be placed in a suspended mode when it is closed, and can resume active computation when it is opened. Similarly, a communication device can accept a call when it is opened and disconnect a call when it is closed. In such cases, the magnetic field sensor is placed in one of the flip device's components, and the associated magnetic field producing unit is placed in the other of the flip device's components, such that, when the device is closed, the two are in proximity to one another, and when the device is open, they are separated from one another. Such operation requires that they be placed a reasonable distance from the hinge rotational axis so that the magnetic field sensor and the magnetic field producing unit sufficiently move apart from one another.

Should a third position become useful for a flip device, the currently utilized magnetic field sensors require a flip-and-rotate arrangement for the two component halves of the flip device. Specifically, some flip devices can have three modes, namely an open mode, a closed mode, and a reversed mode where the side of one of the components of the flip device that was previously inward, when closed, is now outwardly facing, and the opposite side, which was previously outwardly facing is now inwardly facing. In such a case, the magnetic field producing unit in that component would be reversed, but yet proximate to the magnetic field sensor in the reversed mode. In such a case, the sensor could sense a reversed magnetic field, thereby providing for a third state beyond the prior "open" and "closed" states. However, as can be seen, to effectuate such a reversed mode, and thereby place the magnetic field producing unit proximate to the magnetic field sensor in a reversed position, the flip device would not only need to incorporate a hinge opposite the magnetic field producing unit and the magnetic field sensor, but it would also need to incorporate a pivoting mechanism in the hinge to enable pivoting in a direction orthogonal to the motion provided for by the hinge. Such a device can be complex and costly, and, consequently, less desirable.

SUMMARY OF THE INVENTION

In one embodiment, a magnetic field producing unit and a magnetic field sensor can be incorporated proximate to a hinge such that one of the magnetic field producing unit or the magnetic field sensor rotates around the other. Such rotation can enable the magnetic field sensor to sense a magnetic field present on one side, on an opposite side, and to also be able to detect the lack of a magnetic field, such as when the magnetic field producing unit is positioned orthogonally to the sensing sides of the magnetic field sensor and the magnetic field is no longer passing completely through the magnetic field sensor. The magnetic field sensor can, thereby, detect at least three distinct positional states of a device incorporating the magnetic field producing unit, the magnetic field sensor and the hinge.

In another embodiment, a magnetic field producing unit and a magnetic field sensor that are oriented such that one can rotate around the other can be incorporated into a hinged device to enable the device to present three distinct sets of functionality based on the at least three distinct positional states of the hinged device that can be detected by the magnetic field producing unit and the magnetic field sensor. In one embodiment, such sets of functionality can include tablet-based functionality, keyboard-based functionality and video player functionality.

In a further embodiment, threshold values of the detected magnetic field, that is detected by the magnetic field sensor, can be established to delineate at least three distinct positional states of a hinged device incorporating a magnetic field producing unit and a magnetic field sensor. The threshold values of the detected magnetic field can be established to correspond to deflections of approximately 40 degrees between the magnetic field producing unit and the magnetic field sensor, such that one positional state extends from a deflection of zero degrees to a deflection of approximately 40 degrees between the magnetic field producing unit and the magnetic field sensor, another positional state extends from a deflection of approximately 40 degrees to a deflection of approximately 140 degrees, and a third positional state can extend from a deflection of approximately 140 degrees to a deflection of approximately 180 degrees.

In a still further embodiment, a hinged device having a magnetic field producing unit and a magnetic field sensor, that are oriented such that one can rotate around the other, can enable a user to define various positional states and one or more functions or functionality that can be associated with those positional states. The user can further be allowed to define different deflections between the magnetic field producing unit and the magnetic field sensor to delineate the at least three different positional states.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

BRIEF DESCRIPTION OF THE DRAWINGS

The following detailed description may be best understood when taken in conjunction with the accompanying drawings, of which.

DETAILED DESCRIPTION

The following description relates to the detection of at least three distinct positional states of a hinged device by a magnetic field producing unit and a magnetic field sensor. The magnetic field producing unit and the magnetic field sensor can be positioned within the hinged device so that one of them rotates at least partially around the other one. The magnetic field sensor can, thereby, detect a magnetic field on one side, on an opposite side, and can also detect the absence of a magnetic field when the magnetic field producing unit is orthogonal to the detecting sides of the magnetic field sensor. For purposes of the descriptions below, the term "magnetic field producing unit" means any device, material, or combination thereof that is capable of producing a magnetic field. Similarly, for purposes of the descriptions below, the term "magnetic field sensor" means any device, material, or combination thereof that is capable of sensing, or otherwise detecting, the presence of a magnetic field oriented in at least an orthogonal direction to the sensing or detecting sides of the magnetic field sensor. As such, the term "magnetic field sensor" is intended to include, but is not limited to, Hall effect sensors, giant magnetoresistance sensors and anisotropic magnetoresistance sensors.

The techniques described herein focus on the detection of at least three distinct positional states of a hinged device. However, the teachings below are equally applicable to the detection of positional states of other types of devices and, as such, the descriptions below are not meant to limit the enumerated embodiments to the specific devices referenced.

Figure 1:
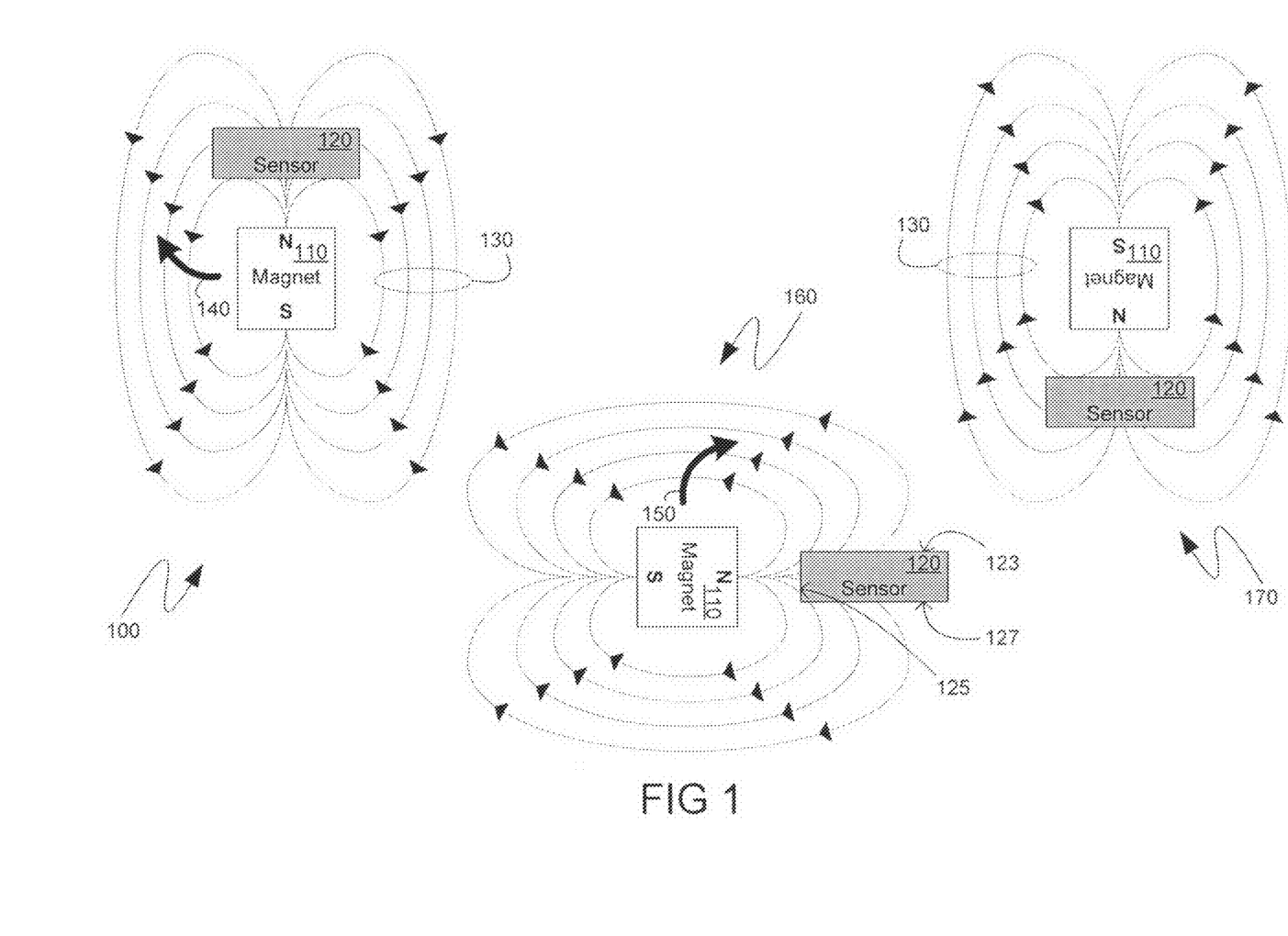
FIG. 1 is a block diagram of an exemplary assembly for detecting at least three positional states comprising a magnetic field producing unit and a magnetic field sensor.

Turning to FIG. 1, a magnetic field producing unit, in the form of the magnet 110, is shown producing a magnetic field 130 oriented in the traditional manner of emanating from the magnet's north pole and terminating at the magnet's south pole. Also shown is a magnetic field sensor, in the form of the sensor 120, that is positioned within the magnetic field 130. In the orientation 100, the magnet 110 is shown producing a magnetic field from below the sensor 120. As will be known by those skilled in the art, the sensor 120 can detect such a magnetic field 130, since it intersects the sensor 120 through both the bottom face 127 and the top face 123.

If the magnet 110 were to be rotated around the sensor 120 in the direction of the arrow 140, an orientation similar to that of orientation 160, could be achieved. As can be seen from the orientation 160, the magnet 110 is positioned orthogonally to the top face 123 and the bottom face 127 of the sensor 120. Consequently, the magnetic field 130 does not intersect both the top face 123 and the bottom face 127 of the sensor 120 in the same direction and, as will be known by those skilled in the art, the sensor will sense little or none of the magnetic field when the magnet 110 is oriented proximally to the side face 125 of the sensor 120, as shown by the orientation 160.

If the magnet 110 were to continue to be rotated around the sensor in the direction of the arrow 150, an orientation similar to that of orientation 170, could be achieved. As can be seen from the orientation 170, the magnet 110 is on the opposite side of the sensor 120 from its position in orientation 100. Consequently, as also shown by the orientation 170, the magnetic field 130 can again intersect the sensor 120, passing through both the top face 123 and the bottom face 127, but now in a direction opposite to that in which it passed through those faces in orientation 100. As will be known by those skilled in the art, the sensor 120 in the orientation 170 can, thereby detect a magnetic field of approximately equal and opposite strength to the magnetic field it detected in the orientation 100.

In one embodiment, the orientations of the magnet 110 and the sensor 120 in orientations 100, 160 and 170 can represent the basis for the detection of at least three different positional states of two components, one of which can comprise the magnet 110, while the other can comprise the sensor 120. A first positional state can be similar to that shown in orientation 100. A second positional state can be similar to that shown in orientation 160, such that, as the magnet 110 moves in the direction of the arrow 140, a threshold is passed and the detection of the first positional state ends and the detection of the second positional state begins. A third positional state can then be similar to that shown in orientation 170, such that, as the magnet 110 moves in the direction of the arrow 150, another threshold is passed and the detection of the second positional state ends and the detection of the third positional state begins.

Figure 2:
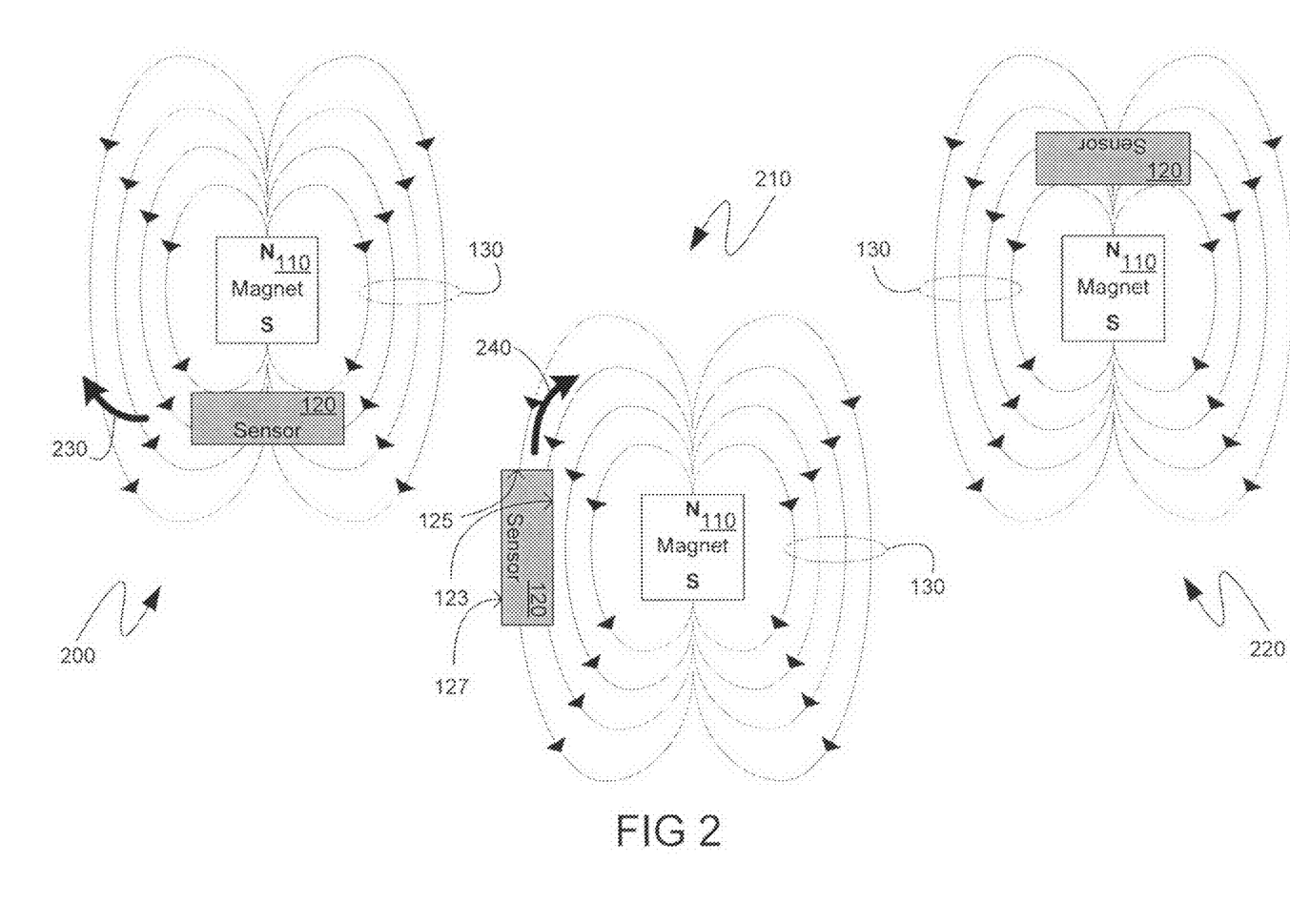
FIG. 2 is a block diagram of another exemplary assembly for detecting at least three positional states comprising a magnetic field producing unit and a magnetic field sensor.

Turning to FIG. 2, positional states of the magnet 110 and the sensor 120 analogous to those shown in FIG. 1 are illustrated, except that, as shown in FIG. 2, the sensor 120 rotates around the magnet 110. As can be seen, the net effect is equivalent to that illustrated in FIG. 1 and the operation of the sensor assembly, comprising the magnet 110 and the sensor 120, is equivalent irrespective of which one of them rotates around the other one. Specifically, in the orientation 200, the sensor 120 can be positioned below the magnet 110 such that the magnetic field 130 intersects the sensor passing through both the top face 123 and the bottom face 127 in the same direction. If the sensor 120 is rotated in the direction of the arrow 230, it can result in an orientation similar to that of orientation 210, with the sensor 120 orthogonal to the orientation of the magnet 110 and the magnetic field 130 not substantially passing through either the top side 123, nor the bottom side 127, of the sensor 120. If the sensor 120 is then further rotated in the direction of the arrow 240, an orientation similar to that of orientation 220 can be achieved with the sensor 120 now above the magnet 110. In the orientation 220, the magnetic field 130 can pass through the top face 123 of the sensor 120 (now oriented downward) and the bottom face 127 of the sensor (now oriented upward) in the same direction, though opposite to the direction in which it intersected those faces in orientation 200.

Comparing the orientations 200, 210 and 220 to the orientations 100, 160 and 170 of FIG. 1, the orientation 210 can be analogous to the orientation 160, with the sensor 120 detecting little, if any, of the magnetic field 130 due to the fact that only a little, or none at all, of the magnetic field passes through, in the same direction, both the top face 123 and the bottom face 127 of the sensor 120. The orientation 200 can be analogous to the orientation 100, with the magnetic field 130 passing through the sensor 120 by "entering" through the bottom face 127 and "exiting" through the top face 123. In the orientation 100, the sensor 120 is positioned proximate to the north pole of the magnet 110, and in the orientation 200 it is positioned proximate to the south pole of the magnet, but the direction of the magnetic field 130 through the sensor 120 remains the same in both orientations, as indicated. Similarly, the orientation 220 can be analogous to the orientation 170, with the magnetic field 130 passing through the sensor 120 by "entering" through the top face 123 and "exiting" through the bottom face 127. In the orientation 170, the sensor 120 is positioned proximate to the north pole of the magnet 110, and in the orientation 220 it is positioned proximate to the south pole of the magnet, but, again, as indicated, the direction of the magnetic field 130 through the sensor 120 remains the same in both orientations. Thus, as can be seen, the rotation of either the magnetic field producing unit around the magnetic field sensor, or the rotation of the magnetic field sensor around the magnetic field producing unit, produces equivalent results. Consequently, in the descriptions that follow, the description or reference to one such embodiment is meant to cover all such equivalent embodiments.

Figure 3:
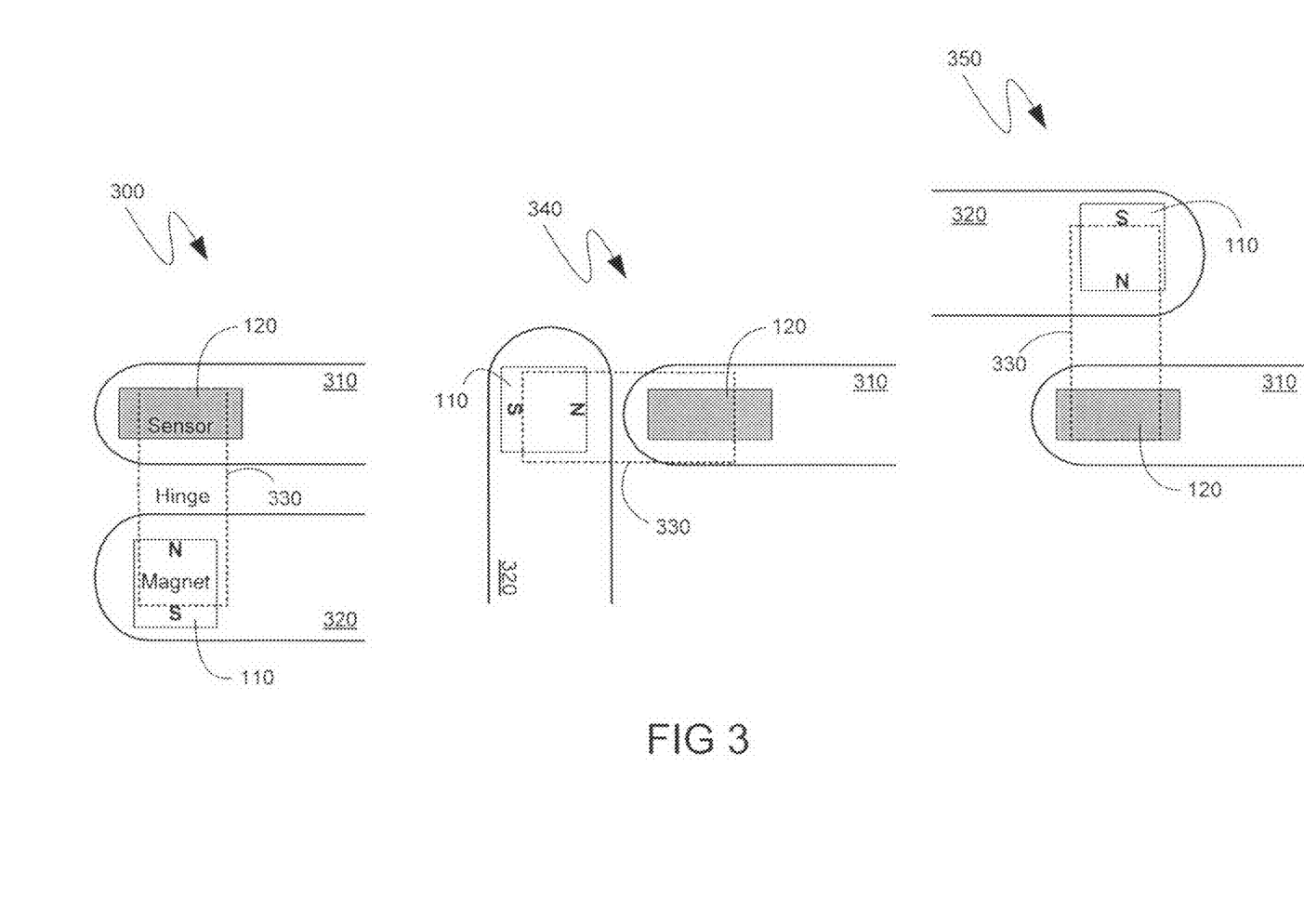
FIG. 3 is a block diagram of a portion of an exemplary hinged device that can detect at least three positional states.

Turning to FIG. 3, an example of the magnetic field producing unit and magnetic field sensor, of the arrangement illustrated in FIGS. 1 and 2 is shown incorporated into a hinged device having two components 310 and 320 connected by a hinge 330. More specifically, the orientations of FIG. 3 are analogous to those of FIG. 1, with the magnet 110 rotating at least partially around the sensor 120. However, as indicated, and illustrated, above, alternative rotational arrangements are equivalent, and the descriptions of FIG. 3 are equally applicable to them.

In FIG. 3, the magnet 110 and the sensor 120 are shown incorporated into components 310 and 320 of the illustrated hinged device. In the illustrated embodiment, the sensor 120 and the magnet 110 are shown as being positioned proximate to the hinge 330, though other positions that accomplish equivalent movement of the magnet and sensor are equally applicable.

When the hinged device of FIG. 3 is in the orientation 300, the magnet 110 and the sensor 120 can interact in the manner described above with respect to orientation 100. Specifically, the sensor 120 can sense the magnetic field being produced by the magnet 110. In one embodiment, the orientation 300 can be considered the "closed" position of the hinged device that comprises components 310 and 320, with the inward facing sides of components 310 and 320 facing each other, and the components 310 and 320 substantially overlapping so as to form a closed, "clamshell" shape. In such an embodiment, the sensing of the magnetic field by the sensor 120 in the manner described above with reference to orientation 100 of FIG. 1 can be utilized as an indication that the hinged device is in the closed positional state and can, thus, sense such a positional state.

When the hinged device is opened somewhat, such as, for example, in the orientation 340, where the components 310 and 320 are positioned approximately orthogonal to one another, the orientation of the magnet 110 and the sensor 120 can be analogous to that of orientation 160 of FIG. 1, and their interaction can be as described above. Specifically, the sensor 120 can, as indicated previously, sense little or none of the magnetic field produced by the magnet 110. In one embodiment, the orientation 340 can be considered an "intermediate" position of the hinged device, with the components 310 and 320 sufficiently apart from one another that, for example, the component 320 can support the vertical, or approximately vertical, positioning of the component 310 when the component 320 is placed upon a level surface. As will be shown, if the component 310 comprises a display, the intermediate position can provide for a stand-alone support for the angling of the display in the component 310 in an optimal position for viewing by one or more users without requiring one of the users to hold the hinged device. In such an embodiment, the detection, by the sensor 120, of little or none of the magnetic field produced by the magnet 110, can be utilized as an indication that the hinged device is in the intermediate positional state. Consequently, a sensor assembly comprising the sensor 120 and the magnet 110, such as in the manner shown in FIG. 3, can sense such an intermediate positional state.

If the hinged device comprising the components 310 and 320 is opened fully, such as in the orientation 350, the magnet 110 and the sensor 120 can be positioned in an equivalent manner, and can interact in an equivalent manner, to that described above with reference to orientation 170. As can be seen from the orientation 350, in one embodiment, such an "open" or "fully open" positional state of the hinged device can comprise the positioning of the components 310 and 320 in a substantially parallel, but outwardly spreading manner, where both of the sides of the components 310 and 320 that were previously inward facing in the orientation 300, are fully, or approximately fully, exposed in the orientation 350.

As described above with reference to the analogous orientation 170, in the orientation 350, the sensor 120 can sense the magnetic field being produced by the magnet 110 in an approximately equal magnitude as that sensed in the orientation 300, except with an opposite value or direction. Such a sensing of a reversed magnetic field can be the basis of a detection of the open positional state, thereby enabling the sensor assembly comprising the sensor 120 and the magnet 110 to detect a third positional state of the hinged device comprising the components 310 and 320.

Figure 4:
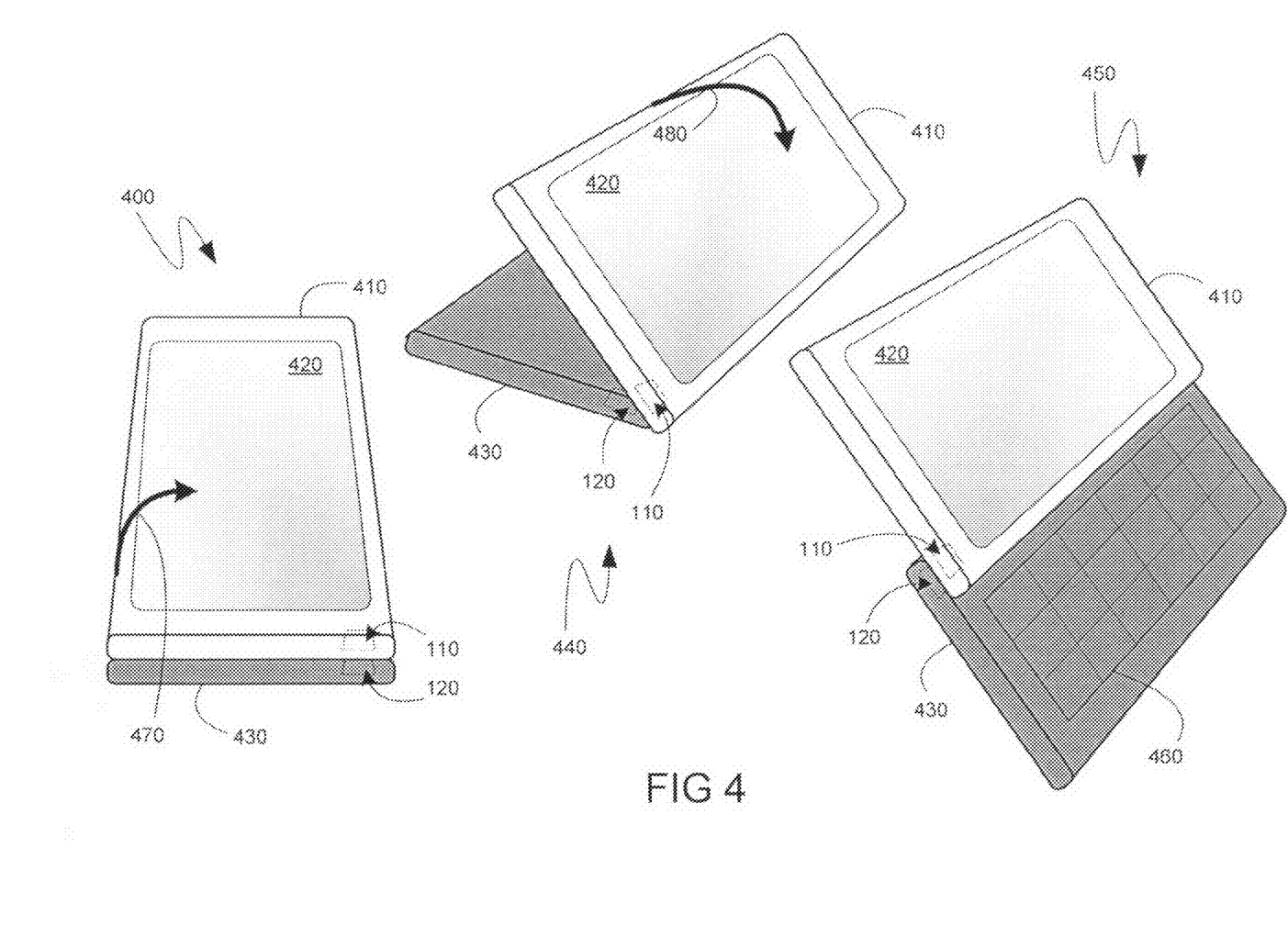
FIG. 4 is a perspective diagram of an exemplary hinged device that can detect at least three positional states.

FIG. 4 provides an illustration of an exemplary hinged device that can utilize such at least three positional state detection to provide different functions and functionality depending on the detected positional state of the hinged device. As can be seen, the hinged device of FIG. 4 comprises two components 410 and 430, which can be analogous to the generic components 310 and 320 of FIG. 3. The component 410 can comprise a screen 420 or other display or information presentation unit, while the component 430 can comprise a keyboard 460 or other information entry device. While the hinge of the hinged device, such as the hinge 330 of FIG. 3, is not specifically illustrated in FIG. 4, the operation of the device, as illustrated by the orientations 400, 440 and 450, clearly shows the hinging action of the device. The sensor assembly, however, comprising the magnet 110 and the sensor 120, is illustrated for reference. Again, as indicated previously, while the hinged device of FIG. 4 comprises a magnet 110 in the component 410 and a sensor 120 in the component 430, the positions of the magnet and sensor can be reversed while maintaining equivalent operation. Thus, the descriptions that reference such an orientation of the component parts of the sensor assembly are meant to be inclusive of all such equivalent embodiments.

The orientation 400 of the hinged device, as illustrated in FIG. 4, can be considered a closed orientation, since the top component 410 is substantially overlapping the bottom component 430, such that their inward facing sides are almost completely, or completely, in contact. As indicated previously, the orientation 400 can be detected by the sensor assembly comprising the magnet 110 and the sensor 120 because the magnetic field produced by the magnet 110 can be detected by the sensor 120, as they are positioned approximately one on top of the other, as shown.

The exemplary hinged device of FIG. 4 can, in the orientation 400, present functions or functionality commensurate with tablet-based computing device or communicational device functionality. For example, the outward-facing display 420 in the orientation 400 can be utilized as a touch-screen, enabling a user to access functions or perform tasks by touching the display 420. Such functions can include making phone calls, browsing network-based information stores, taking handwritten notes or other such functions.

If the component 410 is rotated away from the component 430 in the direction of the arrow 470, the hinged device of FIG. 4 can, eventually, reach an orientation similar to that shown as orientation 440. In particular, as can be seen, the component 410 has been rotated such that it is deflected at least 40 degrees from the component 430. As indicated previously, such an orientation can be detected by the sensor assembly comprising the magnet 110 and the sensor 120 because the sensor can cease to detect much or all of the magnetic field produced by the magnet 110, as the magnet 110 can be substantially orthogonal to the detecting faces of the sensor 120, such as in the orientations 160 or 210, described previously.

In one embodiment, the exemplary hinged device of FIG. 4 can utilize the detection of an orientation such as orientation 440, to present a different set of features or functionality than the hinged device presented in the orientation 400. For example, in the orientation 440, with the screen 420 substantially outward facing and supported by the component 430, the hinged device can provide video entertainment functionality, such as a video player or other visual entertainment device. The user of such a hinged device can then angle the display 420 so as to best be able to view the entertainment, but would not need to hold the hinged device. Alternatively, the hinged device, in the orientation 440, could provide other functionality that can, likewise, benefit from the substantially outward facing screen 420. For example, the hinged device, in the orientation 440, could provide alarm clock functionality. As yet another alternative, the hinged device, in the orientation 440, could provide music player functionality.

If the component 410 of the hinged device continued to be rotated away from the component 430 in the direction of the arrow 480, the hinged device can eventually reach an orientation similar to orientation 450, where the component 410 has rotated completely, or almost completely, away from the component 430, such that the outward-facing sides of the components 410 and 430 from the orientation 400 now face in substantially the same direction. The rotation of the component 410 to the position indicated in the orientation 450, can result in the placement of the magnet 110 on substantially the opposite side of the sensor 120 that it was in the orientation 400. Consequently, the orientation of the sensor assembly in the orientation 400 can be analogous to that illustrated in the orientation 170 or 220, and described previously. In the manner described, therefore, the sensor assembly comprising the magnet 110 and the sensor 120 can detect a third position of the hinged device of FIG. 4, namely the position illustrated substantially by the orientation 450.

In one embodiment, the exemplary hinged device of FIG. 4 can utilize the detection of an orientation analogous to that illustrated by orientation 450 to present a third, different set of functions and functionality, differing from that presented when the hinged device was in one of the prior-described orientations. For example, the orientation 450 can enable the display 420 to be visible from the same side of the hinged device as a keyboard 460, thereby enabling data entry through the keyboard 460, and, consequently, keyboard-based functionality, such as the composing of email or instant messages, the editing of textual or numerical material, or other like functions.

Figure 5:
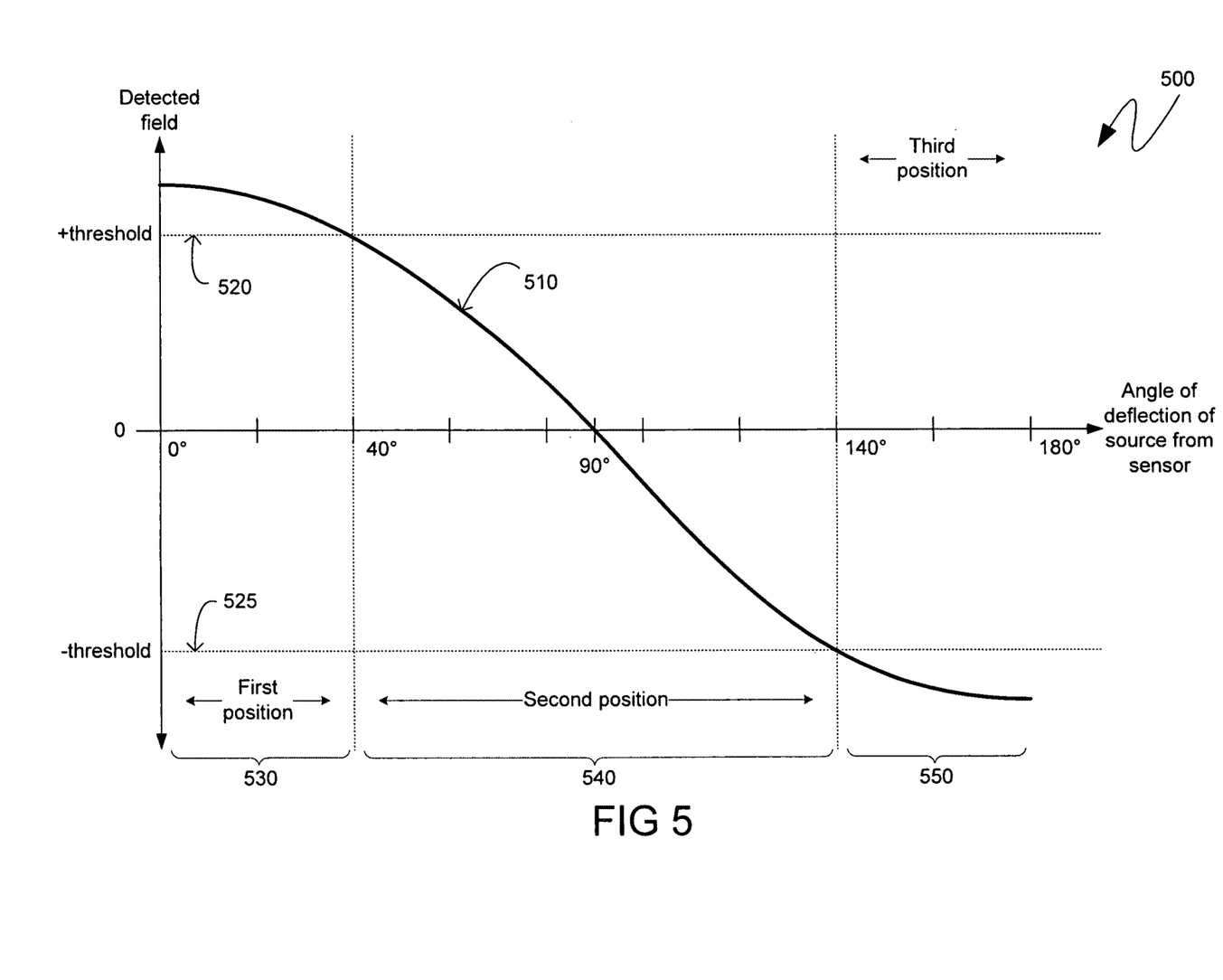
FIG. 5 is a graph diagram of an exemplary detected field and associated threshold values for detecting at least three positional states.

While the component 410 of the hinged device of FIG. 4 rotates in the direction illustrated through the orientations 400, 440 and 450, the magnetic field detected by the magnetic field sensor of the sensing assembly, such as the sensor 120, can vary approximately in the manner illustrated by the graph of FIG. 5. Turning to FIG. 5, an exemplary detected magnetic field as a function of the angle of deflection of the magnet 110 from the sensor 120 is shown. As can be seen, the detected field 510 can initially be defined to be positive, such as in an orientation of the magnet 110 and the sensor 120 substantially similar to that shown in orientations 100 or 200. Subsequently, as the magnet 110 is deflected from the sensor 120, or vice versa, the strength of the magnetic field detected 510 by the sensor 120 can decrease, as shown, until the detected magnetic field 510 is approximately zero at a deflection of approximately 90 degrees. Such a position can correspond to the orientation 160 or the orientation 210, described and illustrated previously.

Further deflection of the magnet 110 from the sensor 120 can result in the detected magnetic field 510 becoming a negative value, to indicate that the magnetic field being detected by the sensor is oriented in an opposite direction to that detected previously. Such a detected magnetic field 510 can increase in absolute value until the magnet 110 is approximately 180 degrees opposite its original starting point.

As indicated previously, in one embodiment, threshold values, such as the threshold value 520 and an equal and opposite negative valued threshold value 525 can be established to delineate different positional orientations of the magnet 110 and the sensor 120 with respect to one another. Thus, as shown in FIG. 5, once the detected magnetic field 510 crosses the threshold 520, for example, the detected orientation of a device utilizing a sensor detecting such a magnetic field can be found to change from a defined first position 530 to a defined second position 540. In the illustrated example of FIG. 5, such a threshold value 520 can correspond to a deflection between the magnet 110 and the sensor 120 of approximately 40 degrees.

Further deflection of the magnet 10 from the sensor 120 can eventually result in the detected magnetic field 510 crossing a second threshold, such as the negative, but equally valued threshold 525. The crossing, by the detected magnetic field of such a threshold 525 can correspond to a sensed change from the second position 540 of a device utilizing a sensor detecting such a magnetic field, to a third position 550. In the illustrated example of FIG. 5, such a second threshold value 525 can correspond to a deflection between the magnet 110 and the sensor 120 of approximately 140 degrees. Thus, in the illustrated example of FIG. 5, the detected magnetic field, detected by a sensor, such as sensor 120, of a sensor assembly, can be utilized to define and, thus, detect, at least three different positional orientations.

As can be seen from the above descriptions, mechanisms for detecting at least three different positional orientations with a sensor assembly comprising a magnetic field producing unit and a magnetic field sensor have been presented. In view of the many possible variations of the subject matter described herein, we claim as our invention all such embodiments as may come within the scope of the following claims and equivalents thereto.

We claim:

1. A method of detecting more than two relative orientations of two parts of a device having a two part housing where the two parts move relative to one another, the method comprising the steps of:
   detecting, by a magnetic field sensor in a first one of the two parts, a magnetic field in a first orientation emitted by a magnetic field producing unit in a second one of the two parts, the magnetic field in the first orientation entering a first side of the magnetic field sensor;
   detecting, by the magnetic field sensor, the magnetic field in a second orientation emitted by the magnetic field producing unit, the magnetic field in the second orientation entering a second side of the magnetic field sensor, the second side being opposite the first side; and
   detecting, by the magnetic field sensor, a magnetic field in a third orientation emitted by the magnetic field producing unit, the magnetic field in the third orientation entering a third side of the magnetic field sensor, the third side being adjacent to both the first side and the second side;
   determining that the device is in a first orientation based, at least in part, on the detecting of the magnetic field in the first orientation;
   determining that the device is in a second orientation based, at least in part, on the detecting of the magnetic field in the second orientation; and
   determining that the device is in a third orientation based, at least in part, on the detecting the presence or absence of the magnetic field in the third orientation.

2. The method of claim 1, wherein the device comprises a hinge connecting the first part of the device, comprising the magnetic field producing unit, to the second part of the device, comprising the magnetic field sensor, and wherein further the magnetic field producing unit and the magnetic field sensor are located proximally to the hinge.

3. The method of claim 2, wherein at least one of the magnetic field producing unit and the magnetic field sensor is near a pivot point of the hinge.

4. The method of claim 1, further comprising the steps of selecting one of a plurality of different functions of the device in response to the determining that the device is in the first orientation, the determining that the device is in the second orientation, and the determining that the device is in the third orientation.

5. The method of claim 4, wherein the step of selecting one of a plurality of different functions of the device comprises selecting a tablet-based device function in response to the determining that the device is in the first orientation.

6. The method of claim 4, wherein the step of selecting one of a plurality of different functions of the device comprises selecting a keyboard-based device function in response to the determining that the device is in the second orientation.

7. The method of claim 4, wherein the step of selecting one of a plurality of different functions of the device comprises selecting a function that utilizes a self-supported, substantially outward facing display of the device in response to the determining that the device is in the third orientation.

8. A hinged device comprising:
   a hinge;
   a first section comprising one of a magnetic field producing unit and a magnetic field sensor, the one of the magnetic field producing unit and the magnetic field sensor being located proximally to the hinge; and
   a second section comprising an other of the magnetic field producing unit and the magnetic field sensor, the other of the magnetic field producing unit and the magnetic field sensor being located proximally to the hinge;
   wherein the hinge couples the first section to the second section such that a portion of the first section can be rotated around an end of the second section from an initial position of the hinged device to a final position of the hinged device, wherein, in the initial position of the hinged device, the portion of the first section is proximate to a first side of the end of the second section, and wherein, in the final position of the hinged device, the portion of the first section is proximate to a second side of the end of the second section, the second side being opposite the first side; and
   wherein further the magnetic field sensor senses a magnetic field oriented in a first direction when the hinged device is in the initial position, a magnetic field oriented in a second direction substantially opposite the first direction when the hinged device is in the final position, and a magnetic field oriented in a radial direction between the first direction and the second direction when the hinged device is in an intermediate position between the initial position and the final position.

9. The hinged device of claim 8, wherein, when the hinged device is in the initial position, the magnetic field enters a first side of the magnetic field sensor and when the hinged device is in the final position, the magnetic field enters a second side of the magnetic field sensor, the second side of the magnetic field sensor being opposite the first side of the magnetic field sensor.

10. The hinged device of claim 8, wherein the portion of the first section comprises the one of the magnetic field producing unit and the magnetic field sensor, and wherein further the second section comprises the other of the magnetic field producing unit and the magnetic field sensor near a pivot point of the hinge.

11. The hinged device of claim 8, further comprising a user interface through which a plurality of different functions of the hinged device can be accessed, wherein a particular one of the plurality of different functions of the hinged device accessible through the user interface differs depending on whether the hinged device is in the initial position, in the final position, or in the intermediate position.

12. The hinged device of claim 11, wherein a user of the hinged device can associate at least one of the plurality of different functions of the hinged device with each of the initial position of the hinged device, the final position of the hinged device, and the intermediate position of the hinged device.

13. The hinged device of claim 11, wherein the particular one of the plurality of different functions of the hinged device accessible through the user interface is a tablet-based device function if the hinged device is in the initial position.

14. The hinged device of claim 11, wherein the particular one of the plurality of different functions of the hinged device accessible through the user interface is a keyboard-based device function if the hinged device is in the final position.

15. The hinged device of claim 11, wherein the particular one of the plurality of different functions of the hinged device accessible through the user interface utilizes a self-supported, substantially outward facing display of the device if the hinged device is in the intermediate position.

16. A sensor assembly comprising a magnetic field producing unit and a magnetic field sensor with an output, wherein the magnetic field producing unit and the magnetic field sensor are positioned such that one of the magnetic field producing unit and the magnetic field sensor rotates sufficiently around an other of the magnetic field producing unit and the magnetic field sensor so as to direct a magnetic field to a first side of the magnetic field sensor in a first position of the sensor assembly and so as to direct the magnetic field to a second side of the magnetic field sensor in a second position of the sensor assembly, wherein the second side is opposite the first side, and wherein the output of the magnetic field sensor indicates whether the sensor assembly is in the first position, the second position, or an intermediate position between the first position and the second position.

17. The sensor assembly of claim 16, wherein the output indicates that the sensor assembly is:
   in the first position if the magnetic field enters the first side of the magnetic field sensor;
   in the second position if the magnetic field enters the second side of the magnetic field sensor;
   and in the intermediate position if the magnetic field does not enter the first or second side of the magnetic field sensor.

18. The sensor assembly of claim 16, wherein the magnetic field producing unit is a magnet.

19. The sensor assembly of claim 16, wherein the magnetic field sensor is a Hall effect sensor.

20. The sensor assembly of claim 16, wherein the magnetic field sensor is a magnetoresistance sensor.

\* \* \* \* \*